United States Patent
Lundquist

(10) Patent No.: US 6,259,243 B1
(45) Date of Patent: Jul. 10, 2001

(54) METHOD FOR ELECTROMAGNETICALLY SHIELDING INDUCTIVE VOLTAGE DETECTORS

(76) Inventor: Lynn C. Lundquist, 10833 NE. Russell, Porland, OR (US) 97220

( * ) Notice: Subject to any disclaimer, the term of this patent is extended or adjusted under 35 U.S.C. 154(b) by 0 days.

(21) Appl. No.: 09/325,833

(22) Filed: Jun. 4, 1999

(51) Int. Cl.⁷ .............. G01R 31/02; G01R 1/30; G01R 19/14; H01H 31/02
(52) U.S. Cl. .............. 324/72.5; 324/123 R; 324/133; 324/515; 324/555; 324/556; 324/552
(58) Field of Search .............. 324/72.5, 133, 324/123 R, 552, 555, 515, 556, 657

(56) References Cited

U.S. PATENT DOCUMENTS

| | | | |
|---|---|---|---|
| 3,337,801 | 8/1967 | Rinier et al. | 324/133 |
| 3,437,928 | 4/1969 | Baker et al. | 324/133 |
| 3,444,465 * | 5/1969 | Teixeira | 324/72.5 |
| 3,525,939 * | 8/1970 | Cartmell | 324/133 |
| 3,774,110 | 11/1973 | Roveti | 324/133 |
| 3,786,468 | 1/1974 | Moffitt | 340/515 |
| 3,828,256 | 8/1974 | Liu | 324/133 |
| 3,878,459 | 4/1975 | Hanna | 324/555 |
| 4,006,409 * | 2/1977 | Adams | 324/510 |
| 4,066,953 | 1/1978 | Gold | 324/123 R |
| 4,084,134 | 4/1978 | Nagano | 324/133 |
| 4,205,264 | 5/1980 | Gold | 324/556 |
| 4,349,783 * | 9/1982 | Robson et al. | 324/457 |
| 4,758,792 | 7/1988 | Polonis et al. | 324/552 |
| 5,001,436 * | 3/1991 | Scot et al. | 324/689 |
| 5,052,948 * | 10/1991 | Hyzin | 439/607 |
| 5,105,181 | 4/1992 | Ross | 340/657 |
| 5,150,038 | 9/1992 | Kanemaru et al. | 324/72.5 |
| 5,150,282 * | 9/1992 | Tomura et al. | 361/818 |
| 5,293,113 | 3/1994 | Beha et al. | 324/72.5 |
| 5,703,324 * | 12/1997 | Harder | 174/21 C |

* cited by examiner

*Primary Examiner*—Glenn W. Brown
*Assistant Examiner*—Wasseem H. Hamdan
(74) *Attorney, Agent, or Firm*—Lynn Lundquist

(57) ABSTRACT

The method of this invention provides a means for altering commonly available inductive voltage detector instruments into dual sensitivity test instruments. By shielding the sensor probe with a metallic material, the probe is made to be unresponsive to energized conductors in near proximity when the shield is grounded by finger contact. A single probe window is provided so that when grounded, the instrument will respond to an energized conductor in only the probe window area allowing testing of single conductors in wire bundles. When ungrounded by the electrician's finger, the instrument reverts to normal sensitivity. Provision is made for safety by isolating the metallic shield from contact with energized conductors. The method may be employed by means of a demountable accessory or incorporated into the test instrument during manufacture.

6 Claims, 2 Drawing Sheets

METHOD FOR ELECTROMAGNETICALLY SHIELDING INDUCTIVE VOLTAGE DETECTORS

BACKGROUND

1 Field Of The Invention

The method of this invention provides electromagnetic shielding around the sensor probe of an inductive voltage detector so that during testing, the voltage detector can be used to obtain readings on selected conductors in a wire bundle. Further, this electromagnetic shielding is constructed so that its shielding effect is selective, allowing the user to employ either the full sensitivity range of the inductive voltage detector or selecting a narrow field of sensitivity for the purpose of testing individual wires in a bundle or testing within an electrical panel with high electromagnetic interference.

BACKGROUND

2 Description Of The Prior Art

Inductive voltage detectors are common electrical test instruments carried by field electricians. In their most common form, they are a pencil shaped meter with a pocket clip. Some manufacturers provide larger hand-held units. In most cases, these instruments have a fixed sensitivity threshold which will activate a flashing light and, or annunciator when the probe of the instrument comes within one or two inches of an alternating current source of a specified voltage intensity. Inasmuch as these inductive voltage detectors are sensitive to the voltage induced electromagnetic field surrounding the conductor, the conductor does not need to be carrying current in order to cause the detector to indicate. For this reason, they are useful test instruments to determine whether an electrical conductor is energized. They sense the presence of live conductors without physically contacting electrically energized metal. In this regard, their unidirectional response to a large field area assures that all conductors in a prescribed vicinity are monitored. In general testing, response to a dispersed electromagnetic field is requisite to assuring the location of all hazardous voltages.

Many manufacturers provide inductive voltage detectors. This includes, but is not limited to, Fluke Corporation of Everett, Wash. (model VoltAlert), A. W. Sperry, Inc. of Hauppauge, N.Y. (model VH-601A), Greenlee Textron, Inc. of Rockford, Ill. (models 2010H and 1010) and Tif Instruments, Inc. of Miami, Fla. (models Tic Tracer 100 and Tic Tracer 300).

Several manufacturers, namely A. W. Sperry (model VH-601A) and Greenlee Textron (model 2010H), provide inductive voltage detectors which incorporate sensitivity adjustments. In both cases, the adjustment varies the instrument's response threshold. By setting the detector at its lowest operating sensitivity, the instrument may be somewhat successfully used to test a single conductor in a crowded wire bundle or electrical panel with high electromagnetic radiation. However, varying the instrument's threshold does not alter its unidirectional response to a large field area. That is, the entire probe area remains sensitive to any electromagnetic signal. Generally, depending on the design of the test instrument, the probe will read any electromagnetic signal within 360 degrees around the probe or in a cone shaped field from the tip of the probe. Thus, using such an instrument on its lowest sensitivity setting does not assure that a misleading reading from multiple electromagnetic sources cannot occur.

OBJECTIVES OF THIS INVENTION

The method of this invention was developed to selectively restrict the field of sensitivity of an inductive voltage detector. Furthermore, this method was designed with a number of specific objectives considering its potential application.

1. It is the general objective of this method to modify the function of an inductive voltage detector as presently manufactured so that it may selectively test single conductors in a crowded wire bundle or in an electrical panel with high concentrations of electromagnetic interference.
2. Another objective of this method is to equip the inductive voltage detector with an external removable probe shield so that no manufacturing changes are required in the inductive voltage detector itself. The probe shield is not common to the internal circuitry of the instrument.
3. Another objective of this method is to allow the user to selectively alternate between the full sensitivity range of the inductive voltage detector in its normal setting and selectively test single conductors when necessary.
4. Another objective of this method is to provide an inexpensive adaptation to achieve the objective of selectively limiting the inductive voltage detector's field of sensitivity.
5. A final objective of this method is to provide a clip-on probe shield which is electrically safe without introducing hazard to the operating electrician.

These and other objectives and advantages of the present method, and the manner in which they are achieved, will become apparent in the following specifications and claims.

SUMMARY OF THIS INVENTION

All inductive voltage detectors are sensitive in a region defined by an area circumferentially surrounding the probe or radiating from the tip of the probe in the shape of a cone. In practice, because it serves the manufacturers' interests to increase sensitivity, most such instruments will have both fields of sensitivity with one or the other being a predominant area of sensitivity. Though this greater range of sensitivity is useful in general testing, it generally prevents the inductive voltage detector from selective use on a single conductor when that conductor is in a wire bundle or in an electrical panel. The restriction of general field sensitivity can be altered, however, by surrounding the probe with grounded electromagnetic shielding while providing an unshielded window in the single area of desired sensitivity. When the shield is grounded in this manner, the instrument will be sensitive to an electromagnetic field from a conductor only in the unshielded window area. Live conductors which are adjacent to the shielded areas will not activate the instrument. On the other hand, when the shield is ungrounded, the instrument will return to its original unidirectional sensitivity.

In order to achieve selective grounding of the shield, the metallic shield material is made electrically common to a touch pad located on the outside of the plastic shield covering. When the operator touches the touch pad, the shield becomes effectively grounded. When the operator's finger is removed from the touch pad, the shield returns to its ungrounded state.

In order to assure operator safety from electrical hazard, the probe shield is entirely encased in a plastic covering so that it cannot come into electrical contact with energized parts. Provision is also made for a high resistance element between the probe shield and the touch pad which further protects the operator.

The method of this invention can be applied to any manufacturer's inductive voltage detector.

DESCRIPTION OF THE PREFERRED EMBODIMENTS

Figure 1:
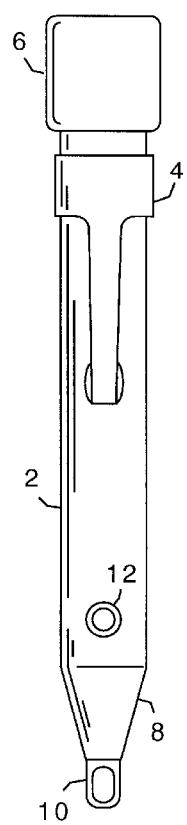
FIG. 1 is an elevation view of a prior art inductive voltage detector.

FIG. 1 shows a typical pencil inductive voltage detector as manufactured by Fluke Corporation and Greenlee Textron, Inc. The instrument consists of a main body 2, a pocket clip 4, a battery cap 6, a translucent display cone 8 and the sensor probe 10. This type of pencil meter will signal the presence of a voltage on a conductor with a flashing light visible through the translucent display cone 8 or an externally mounted light emitting diode 12.

Figure 2:
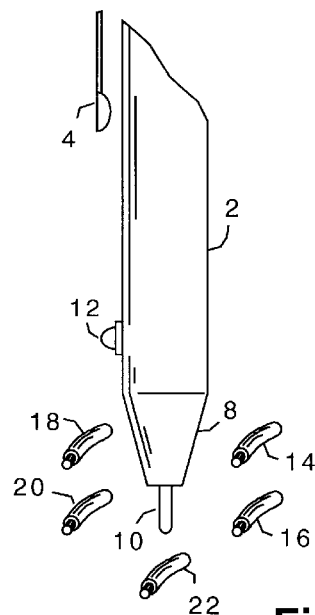
FIG. 2 is a partial elevation view of the prior art inductive voltage detector in FIG. 1 when rotated ninety degrees.

FIG. 2 is the same pencil inductive voltage detector of FIG. 1 rotated ninety degrees. The sensor probe 10 is shown in profile in this view. When the pocket clip 4 is pressed against the main body 2, the internal circuit of the instrument is energized. If an energized conductor is present in any location represented by conductors 14, 16, 18, 20, or 22, the light emitting diode in the translucent display cone 8 (or the externally mounted light emitting diode 12) will flash.

Figure 3:
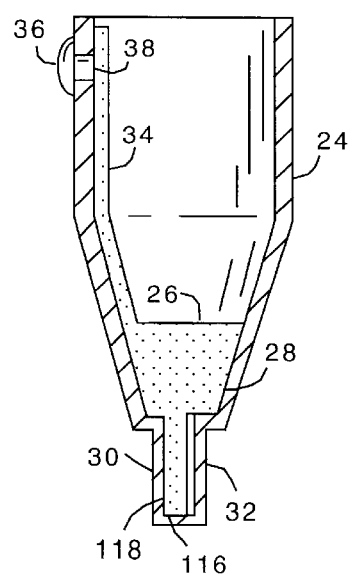
FIG. 3 is a sectional view of a complete shield assembly as used on the inductive voltage detector of FIG. 1.

FIG. 3 shows the construction of the pencil instrument probe shield of this invention. The probe shield consists of a transparent body 24 which conformably slips over the translucent display cone 8 and the sensor probe 10 of the inductive voltage detector as shown in the perspective of FIG. 2. The internal surface of the transparent body 24 is plated with metallic electromagnetic shield 26 material. This shield circumferentially encases the entire sensitive section of the display cone 8 at 28 and one face of the sensor probe 10 at 30. However, the second face of the sensor probe 10 is adjacent to a probe window 32 which allows an electromagnetic field to pass unhindered through the probe window 32 portion of the transparent body 24 and impinge on the sensor probe 10. The electromagnetic shield 26 material is applied extensively from the electromagnetic shield 26 proper so as to provide a shield connector 34 which is in electrical contact with the finger touch pad 36 at 38. To prevent electrical hazard from inadvertent contact with electrically live parts, the entire electromagnetic shield 26 assembly is encased within the insulated plastic transparent body 24.

Figure 4:
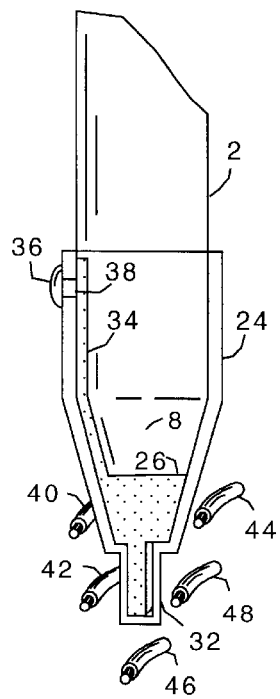
FIG. 4 is a partial elevation view of the inductive voltage detector of FIG. 1 and the shield assembly of FIG. 3.

FIG. 4 shows the transparent body assembly 24 in place on the inductive voltage detector. When the electromagnetic shield 26 is grounded through the touch pad 36, the sensing element in the instrument is shielded from energized conductors 40, 42, 44, and 46. Only energized conductor 48 will activate the circuitry of the instrument because that conductor is adjacent to the unshielded probe window 32.

Figure 5:
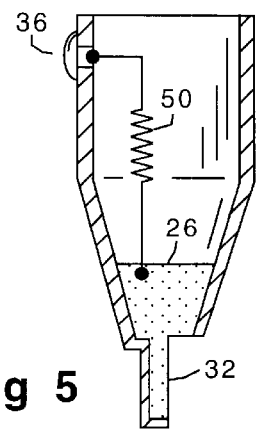
FIG. 5 is a sectional view of a complete shield assembly which incorporates a schematically represented isolation resistance.

FIG. 5 shows another embodiment of the shield assembly. In this embodiment the probe window 32 is open so that the sensor probe 10 is exposed. A high value resistance 50 is interposed between the metallic electromagnetic shield 26 and the finger touch pad 36.

Figure 6:
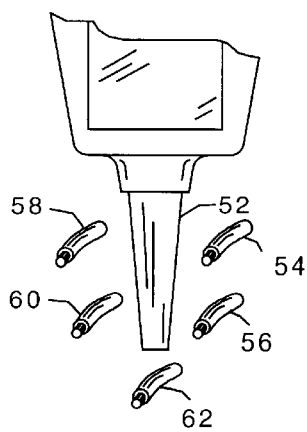
FIG. 6 is a partial elevation view of a second prior art inductive voltage detector configuration.

FIG. 6 shows a second inductive voltage detector probe configuration used by Greenlee Textron, Inc. The sensor probe 52 of this instrument will respond to an energized conductor in any one of the locations identified as 54, 56, 58, 60, or 62.

Figure 7:
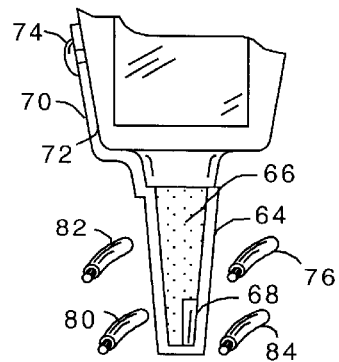
FIG. 7 is a partial elevation view of the inductive voltage detector of FIG. 6 equipped with a shield assembly.

FIG. 7 shows a probe shield mounted on the inductive voltage detector of FIG. 6. In this embodiment the insulating plastic body 64 encases the entire sensor probe 52. A metallic electromagnetic shield 66 is formed on the inside of the insulating plastic body 64 in such a manner that the entire sensor probe 52 is shielded with only the exception of a probe tip window 68. The insulating plastic body 64 has an extended portion 70 which supports the finger touch pad 74 as an integral part of the insulating plastic body 64. The metallic electromagnetic shield 66 is contiguously placed on an inside of the extended portion 70 at 72 so that the electromagnetic shield 66 is common to the finger touch pad 74. When the finger touch pad 74 is grounded, energized conductors at 76, 78, 80, and 82 will be shielded from the sensor probe 52 and will not cause the instrument to emit a signal. On the other hand, the unshielded probe tip window 68 will allow an energized conductor at 84 to cause the instrument to emit a signal.

Figure 8:
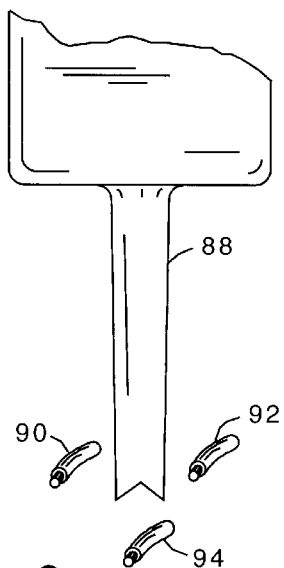
FIG. 8 is a partial elevation view of a third prior art inductive voltage detector configuration.

FIG. 8 shows a third inductive voltage detector probe configuration used by Tif Instruments, Inc. The sensor probe 88 of this instrument has an active portion toward its extremity which will respond to an energized conductor in any one of the locations identified as 90, 92, or 94. This active portion is defined by the area responsive to conductors 90, 92, or 94.

Figure 9:
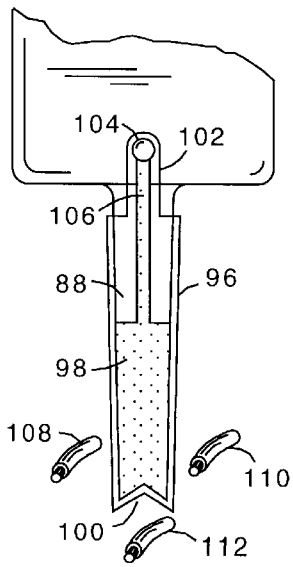
FIG. 9 is a partial elevation view of the inductive voltage detector of FIG. 8 equipped with a shield assembly.

FIG. 9 shows a probe shield mounted on the inductive voltage detector of FIG. 8. In this embodiment the insulating plastic body 96 encases the entire sensor probe 88. A metallic electromagnetic shield 98 is formed on the inside of the insulating plastic body 96 in such a manner that the active portion of the sensor probe is shielded with only the exception of a probe tip window 100. The insulating plastic body 96 has an extended portion 102 which supports the finger touch pad 104 as an integral part of the insulating plastic body 96. The metallic electromagnetic shield 98 is contiguously placed on an inside of the extended portion 102 at 106 so that the electromagnetic shield 98 is conductive with the finger touch pad 104. When the finger touch pad 104 is grounded, energized conductors at 108 and 110 will be shielded from the sensor probe 88 and will not cause the instrument to emit a signal. On the other hand, the unshielded probe tip window 100 will allow an energized conductor at 112 to cause the instrument to emit a signal.

Figure 10:
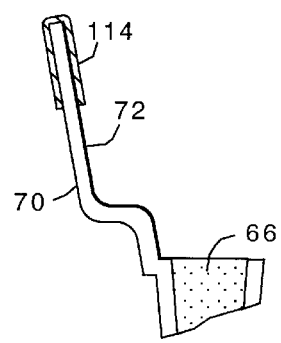
FIG. 10 is a partial elevation view of an alternate touch plate configuration.

FIG. 10 shows an alternate design of the finger touch pad 74 of FIG. 7. In this configuration, a metal plate touch pad 114 is formed to make contact with the metallic electromagnetic shield material 72 contiguously placed on an inside of the extended portion 70 so that the electromagnetic shield 66 is conductive with the metal plate touch pad 114.

OPERATION

FIG. 1 represents a common inductive voltage detector as manufactured by Fluke Corporation or Greenlee Textron, Inc. When an energized conductor is encountered in any location as shown in FIG. 2, the light in the translucent display cone 8 (or the externally mounted light emitting diode 12) will flash, warning the electrician that one or more conductors in this area are energized. In normal testing, it is advantageous to have a wide field of sensitivity so that energized conductors are not inadvertently overlooked. In other manufacturers' inductive voltage detectors, the probe area is similarly sensitive to a unidirectional electromagnetic field as shown in FIGS. 6 and 8.

In certain types of testing, however, it is necessary to determine if a specific conductor is energizer. When testing individual wires which are in a wire bundle or a crowded electrical panel, the removable probe shield shown in any of FIGS. 3, 4, 5, 7, or 9 allows the electrician to shield the probe so that only the area immediately adjacent to the probe window will indicate the presence of an energized conductor.

In actual use, the electrician will turn the inductive voltage detector on by means of its pocket clip 4 or other power switches which are not shown. The electrician may then do a general test in an area using the full field of sensitivity of the instrument. If the instrument indicates an energized conductor in an area occupied by two or more conductors, the electrician may then touch the finger touch pad (36, 74, or 104) which will ground the electromagnetic shield (26, 66, or 98). When thus grounded, the probe will respond only to energized conductors which are placed immediately adjacent to the probe window (32, 68, or 100). FIGS. 4, 7, and 9 indicate the selectivity of the various probe configurations when the probe is shielded. FIG. 3 shows the electromagnetic shielding surrounding the sensor probe 10 at both 1 16 and 118. Only one face of the probe window at 32 is unshielded. In a similar manner, only a single portion of other manufacturers' probes are unshielded as shown at 68 of FIG. 7 and 100 of FIG. 9.

Economy of manufacture is a consideration in the method of this invention. This is best achieved by molding a single piece plastic probe shield which will slip over the respective inductive voltage detector's probe. In order to further reduce manufacturing costs, the electromagnetic shield is plated on the selected interior surfaces of the probe shield as indicated by 26, 66, or 98. A shield connector (34, 72, or 106) is formed by extending the plated electromagnetic shield to extend to, and make electrical contact with, the touch pad (36, 74, or 104). The use of a touch pad as shown in 36, 74, or 104 will require a plastic injection forming die with a moving core section to place a hole in the body (24, 64, or 96). The cost of the plastic injection die may be further reduced by using a formed sheet metal clip for a touch pad 114 as shown in FIG. 10.

The plastic body (24) of the first embodiment of this invention is identified as being transparent. This is necessary in the case of the Fluke Corporation instrument which uses a flashing light signal inside a translucent display cone 8. In all other manufacturers' instruments, the plastic molded body (24 for Greenlee Textron's model number 1010 and 64, or 96 for all others) may be opaque in color.

The electromagnetic shield effectiveness which is a function of the plating thickness is not specified in this invention. In practice, however, the thickness and, or material chosen for the electromagnetic shield will be selected so that when ungrounded, it will have minimal effect on the instrument's sensitivity to energized conductors in the immediate vicinity. The object of this invention is to provide a selectable, dual range instrument. This objective would be defeated if the ungrounded shielding prevented the inductive voltage detector from functioning normally.

Operator safety is a primary concern of the method of this invention. In all cases, the plastic material used for the body (24, 64, or 96) has sufficient insulation value so that the operator is adequately protected from any voltages normally encountered with the inductive voltage detector in question. The preferred embodiment of this invention always completely encapsulates the probe with the insulating material of the body so that the metallic electromagnetic shielding (26, 66 or 98) can never come into contact with live electrical parts. However, provision can also be made with the method of this invention so that isolation between the electromagnetic shielding and the operator may be achieved. FIG. 5 shows a high value resistance element 50 between the electromagnetic shielding 26 and the touch pad 36. A high resistance element of one megohm will protect the operator from electrical shock should the probe come into contact with live electrical conductors of the values specified for these test instruments. For further protection, this high value resistance could be placed in any of the embodiments of this invention shown in FIGS. 3, 4, 7, 9, and 10. FIG. 5 further shows a probe window 32 which does not have an insulated plastic covering, though this is not the preferred embodiment.

In a further embodiment, the electromagnetic shield of FIGS. 4, 5, 7, and 9 may be incorporated into the internal structure of these manufacturers' instruments at the time of construction.

What I claim is:

1. A method for electromagnetically shielding an inductive voltage detecting instrument to sense energized conductors within a restricted field, comprising:

a) shielding the sensor probe of said inductive voltage detecting instrument wherein a metallic electromagnetic shielding material is selectively placed;

b) insulating said metallic electromagnetic shielding material from inadvertent contact with energized electrical conductors; and c) grounding said metallic electromagnetic shielding material by an electrically common path to a finger touch conductor.

2. The method of claim 1 wherein said metallic electromagnetic shielding material is plated inside a non conductive plastic body.

3. The method of claim 1 wherein said metallic electromagnetic shielding material shields all but a single face of said sensor probe.

4. The method of claim 1 wherein said plastic body is transparent.

5. The method of claim 1 wherein said metallic electromagnetic shielding and finger touch grounding conductor are arranged in a single, demountable body extraneous to said inductive voltage detector.

6. The method of claim 1 wherein said metallic electromagnetic shielding and finger touch grounding conductor are integrally built into said inductive voltage detector.

* * * * *